(12) United States Patent
Kusuyama et al.

(10) Patent No.: US 12,201,028 B2
(45) Date of Patent: Jan. 14, 2025

(54) MOUNTABLE ELECTRONIC COMPONENT AND ELECTRONIC CIRCUIT MODULE

(71) Applicant: Murata Manufacturing Co., Ltd., Kyoto (JP)

(72) Inventors: Takafumi Kusuyama, Kyoto (JP); Yoshitaka Echikawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 832 days.

(21) Appl. No.: 17/317,358

(22) Filed: May 11, 2021

(65) Prior Publication Data

US 2021/0265555 A1    Aug. 26, 2021

Related U.S. Application Data

(63) Continuation of application No. PCT/JP2019/044228, filed on Nov. 12, 2019.

(30) Foreign Application Priority Data

Nov. 12, 2018    (JP) .................. 2018-211880

(51) Int. Cl.
*H01L 41/047* (2006.01)
*H01L 23/31* (2006.01)
(Continued)

(52) U.S. Cl.
CPC ........... *H10N 30/875* (2023.02); *H01L 23/31* (2013.01); *H01L 23/5385* (2013.01)

(58) Field of Classification Search
CPC ..................................... H10N 30/88
(Continued)

(56) References Cited

U.S. PATENT DOCUMENTS

2005/0212387 A1* 9/2005 Sasagawa ............ H03H 9/1021
310/348
2006/0038235 A1* 2/2006 Ogata .................. H01L 21/563
257/E21.503
(Continued)

FOREIGN PATENT DOCUMENTS

JP    H07-094622 A    4/1995
JP    2001-332654 A    11/2001
(Continued)

OTHER PUBLICATIONS

International Search Report for International Patent Application No. PCT/JP2019/044228 dated Feb. 4, 2020.
(Continued)

*Primary Examiner* — Derek J Rosenau
(74) *Attorney, Agent, or Firm* — Pearne & Gordon LLP

(57) ABSTRACT

A board has a first main surface and a second main surface. A first electronic component is mounted on a board so that one surface on which an electrical functional unit is formed faces a first main surface. A second electronic component is mounted on the board so that one surface on which an electrical functional unit is formed faces a second main surface. At least a portion of the first electronic component and at least a portion of the second electronic component overlap each other in a plan view. The other surface of the first electronic component is exposed from a mold resin. The other surface of the second electronic component is exposed from a mold resin.

19 Claims, 10 Drawing Sheets

(51) Int. Cl.
*H01L 23/538* (2006.01)
*H10N 30/87* (2023.01)

(58) Field of Classification Search
USPC .......................................................... 310/348
See application file for complete search history.

(56) References Cited

U.S. PATENT DOCUMENTS

2006/0063312 A1* 3/2006 Kurita ..................... H01L 25/50
257/E23.129
2015/0179621 A1 6/2015 Matsumoto et al.

FOREIGN PATENT DOCUMENTS

| JP | 2005-353886 A | 12/2005 |
| JP | 2006-019433 A | 1/2006 |
| JP | 2006-060128 A | 3/2006 |
| JP | 2012-028486 A | 2/2012 |
| JP | 2016-119331 A | 6/2016 |
| JP | 2018-137474 A | 8/2018 |
| WO | 2013/035716 A1 | 3/2013 |
| WO | 2014/017228 A1 | 1/2014 |

OTHER PUBLICATIONS

Written Opinion for International Patent Application No. PCT/JP2019/044228 dated Feb. 4, 2020.

* cited by examiner

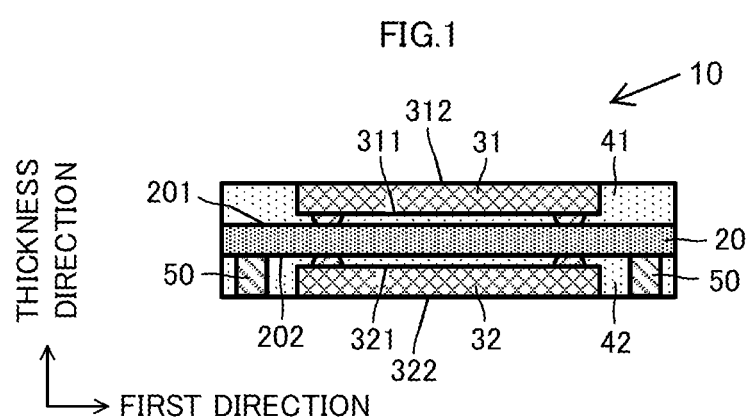

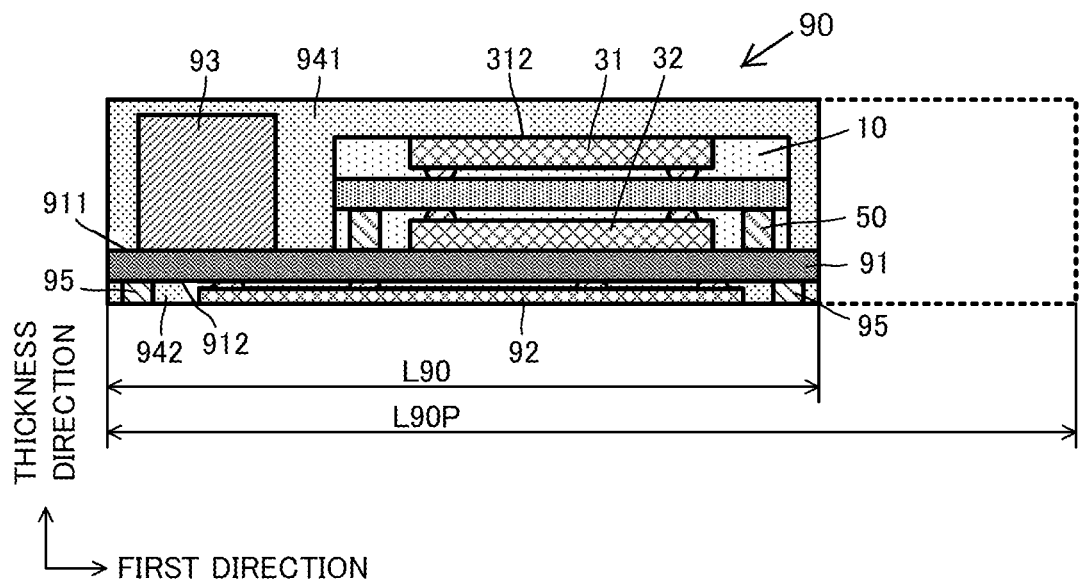
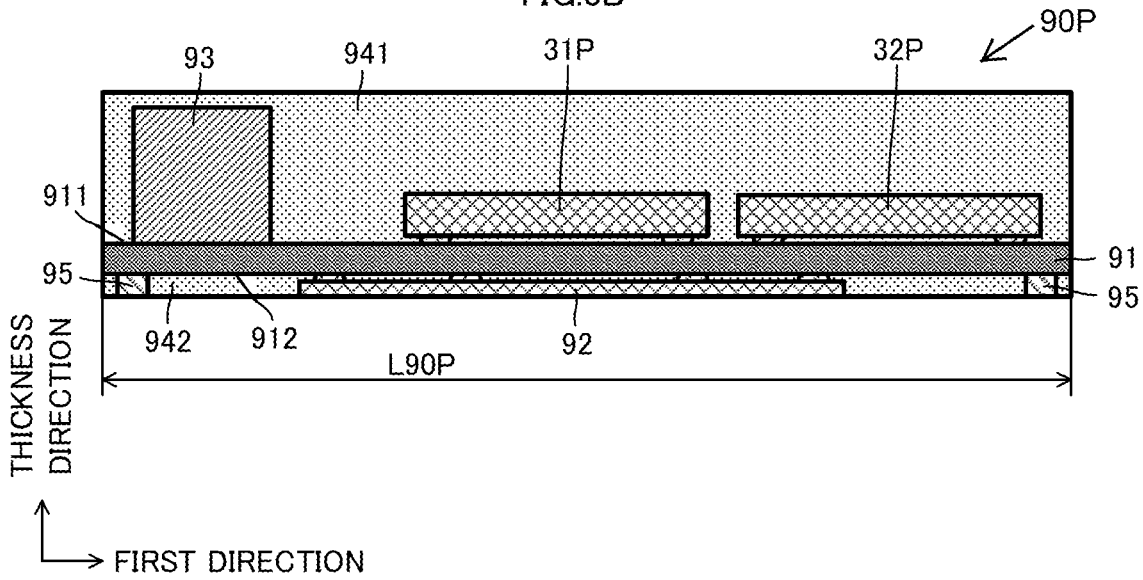

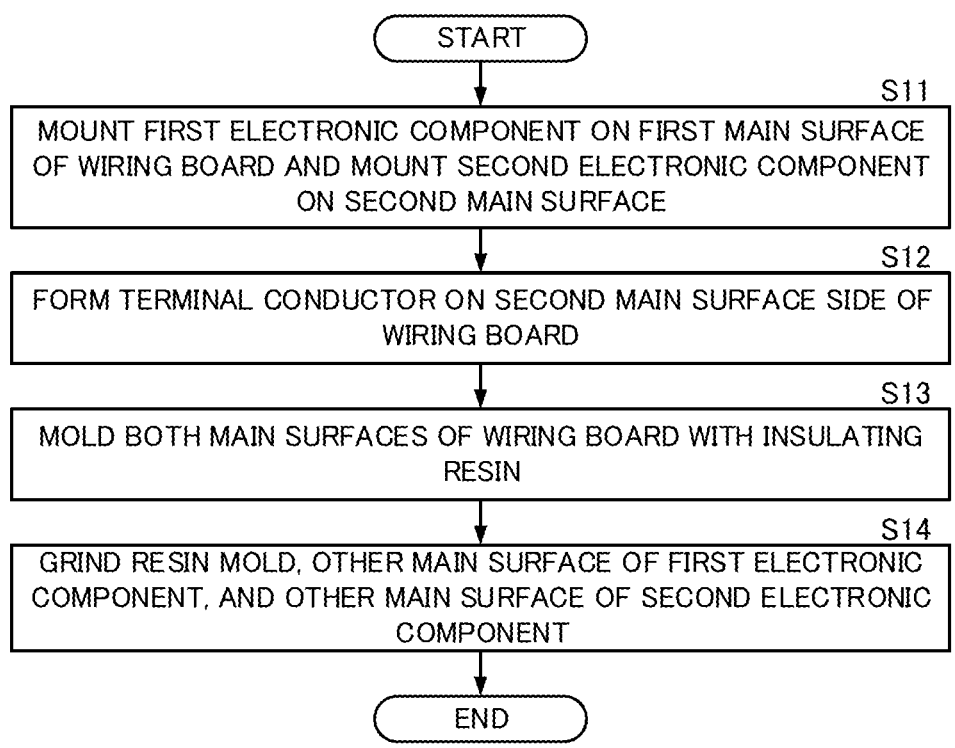

MOUNTABLE ELECTRONIC COMPONENT AND ELECTRONIC CIRCUIT MODULE

CROSS REFERENCE TO RELATED APPLICATIONS

This is a continuation of International Application No. PCT/JP2019/044228 filed on Nov. 12, 2019 which claims priority from Japanese Patent Application No. 2018-211880 filed on Nov. 12, 2018. The contents of these applications are incorporated herein by reference in their entireties.

BACKGROUND OF THE DISCLOSURE

Field of the Disclosure

The present disclosure relates to a mountable electronic component that includes a plurality of electronic components having an electrical functional unit formed on one surface side and is mountable on another circuit board.

Description of the Related Art

A module disclosed in International Publication No. 2014/017228 includes a wiring board, a plurality of chip components, and a semiconductor substrate. The semiconductor substrate is mounted on one surface of the wiring board, and the plurality of chip components are mounted on the other surface of the wiring board.

BRIEF SUMMARY OF THE DISCLOSURE

In the configuration disclosed in International Publication No. 2014/017228, a plurality of semiconductor substrates may be provided, and the plurality of semiconductor substrates may be required to be mounted on the same surface as the surface for the chip components.

However, the semiconductor substrate usually has a plane area larger than the plane area of the chip component. Therefore, the plane area of the module increases depending on the number of semiconductor substrates. This is similarly applied to a case using a piezoelectric substrate in addition to the semiconductor substrate.

Thus, an object of the present disclosure is to provide a mountable electronic component capable of suppressing an increase in size of a module on which a plurality of semiconductor substrates and piezoelectric substrates are mounted, even when these substrates are used.

According to an aspect of the present disclosure, a mountable electronic component includes a board, a first electronic component, a second electronic component, a first mold resin, a second mold resin, and a terminal conductor. The board has a first main surface and a second main surface, and includes a wiring conductor. The first electronic component is mounted on the first main surface. In the first electronic component, a first electrical functional unit is formed on one surface side, and the first electrical functional unit is not formed on the other surface side. The second electronic component is mounted on the second main surface. In the second electronic component, a second electrical functional unit is formed on one surface side, and the second electrical functional unit is not formed on the other surface side. The first mold resin covers at least a portion of the first electronic component and is formed on the first main surface. The second mold resin covers at least a portion of the second electronic component and is formed on the second main surface. The terminal conductor connects the wiring conductor of the board to an external circuit.

The first electronic component is mounted on the board so that the one surface on which the electrical functional unit is formed faces the first main surface. The second electronic component is mounted on the board so that the one surface on which the second electrical functional unit is formed faces the second main surface. At least a portion of the first electronic component and at least a portion of the second electronic component overlap each other when viewed from a thickness direction perpendicular to the first main surface and the second main surface.

The other surface of the first electronic component is exposed from the first mold resin. The other surface of the second electronic component is exposed from the second mold resin.

In this configuration, when viewed from the thickness direction, at least a portion of the first electronic component overlaps at least a portion of the second electronic component. Thus, the entire plane area is reduced in comparison to a case where the first electronic component and the second electronic component are mounted separately. In addition, because the other surface of the first electronic component and the other surface of the second electronic component are exposed, the first mold resin does not overlap the first electronic component, and the second mold resin does not overlap the second electronic component. Thus, the thickness of the mountable electronic component is reduced. Further, since the first electronic component and the second electronic component have electrical functional units on one surface side, the electrical functional units are not damaged even though the thickness of the first electronic component and the thickness of the second electronic component are reduced by grinding so that the other surface side is exposed.

According to another aspect of the present disclosure, a mountable electronic component includes a board, a first electronic component, a second electronic component, a first mold resin, a second mold resin, and a terminal conductor. The board has a first main surface and a second main surface, and includes a wiring conductor. The first electronic component is mounted on the first main surface. In the first electronic component, a first electrical functional unit is formed on one surface side, and the first electrical functional unit is not formed on the other surface side. The second electronic component is mounted on the second main surface. In the second electronic component, a second electrical functional unit is formed on one surface side, and the second electrical functional unit is not formed on the other surface side. The first mold resin covers at least a portion of the first electronic component and is formed on the first main surface. The second mold resin covers at least a portion of the second electronic component and is formed on the second main surface. The terminal conductor connects the wiring conductor of the board to an external circuit.

The first electronic component is mounted on the board so that the one surface on which the electrical functional unit is formed faces the first main surface. The second electronic component is mounted on the board so that the one surface on which the second electrical functional unit is formed faces the second main surface. At least a portion of the first electronic component and at least a portion of the second electronic component overlap each other when viewed from a thickness direction perpendicular to the first main surface and the second main surface.

Only the first electronic component and the second electronic component are mounted on the board.

In this configuration, when viewed from the thickness direction, at least a portion of the first electronic component overlaps at least a portion of the second electronic component. Thus, the entire plane area is reduced in comparison to a case where the first electronic component and the second electronic component are mounted separately.

In addition, since only the first electronic component and the second electronic component are mounted on the board, tall (thick) chip type mounting components such as capacitors, inductors, and resistors are not mounted, and thus the mountable electronic component becomes smaller.

According to the present disclosure, it is possible to suppress an increase in size of a module on which a plurality of semiconductor substrates and piezoelectric substrates are mounted.

BRIEF DESCRIPTION OF THE SEVERAL VIEWS OF THE DRAWINGS

FIG. 1 is a side sectional view illustrating a configuration of a mountable electronic component according to a first embodiment.

FIG. 3A is a side sectional view illustrating a configuration of a first aspect of an electronic circuit module according to the first embodiment, and FIG. 3B is a side sectional view illustrating a configuration of an electronic circuit module to be compared.

FIG. 5 is a flowchart illustrating a method of manufacturing the mountable electronic component according to the first embodiment.

DETAILED DESCRIPTION OF THE DISCLOSURE

Figure 2A:
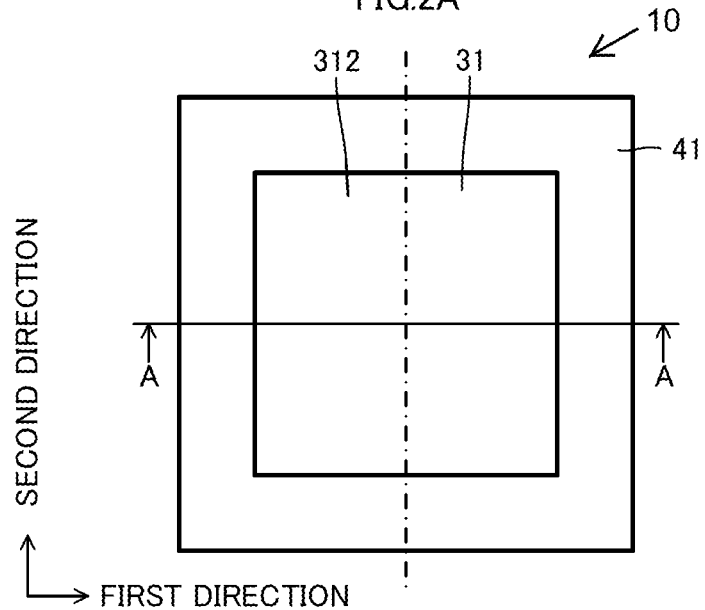
FIG. 2A is a top view illustrating the configuration of the mountable electronic component according to the first embodiment.
Figure 2B:
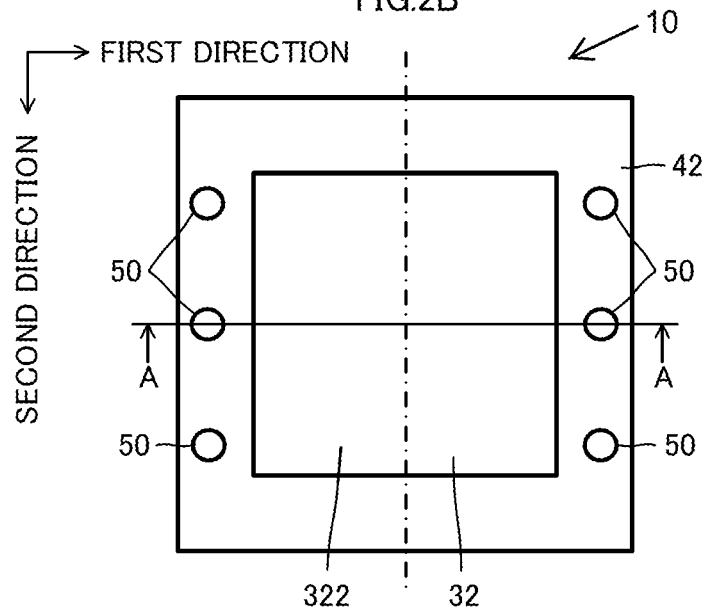
FIG. 2B is a bottom view illustrating the configuration of the mountable electronic component according to the first embodiment.

A mountable electronic component according to a first embodiment of the present disclosure will be described with reference to the drawings. FIG. 1 is a side sectional view illustrating a configuration of the mountable electronic component according to the first embodiment. FIG. 2A is a top view illustrating the configuration of the mountable electronic component according to the first embodiment. FIG. 2B is a bottom view illustrating the configuration of the mountable electronic component according to the first embodiment.

As illustrated in FIGS. 1, 2A, and 2B, a mountable electronic component 10 includes a board 20, a first electronic component 31, a second electronic component 32, a mold resin 41, a mold resin 42, and a terminal conductor 50.

The board 20 is a substantially rectangular flat plate that has the sides respectively parallel to a first direction and a second direction when viewed from the thickness direction. The board 20 includes a first main surface 201 and a second main surface 202 facing each other. The board 20 includes an insulating base and a wiring conductor (not illustrated). The insulating base is made of resin or low temperature co-fired ceramics (LTCC), for example. The wiring conductor is made of a highly conductive material such as Cu or Al, and includes a first land conductor formed on the first main surface 201 and a second land conductor formed on the second main surface 202. The first land conductor and the second land conductor are appropriately connected. The thickness of the board 20 is typically, for example, about 50 μm to about 80 μm, but is not limited to this. The shape of the board 20 is not limited to a substantially rectangular shape so long as the board 20 has a flat plate shape.

The first electronic component 31 is a substantially rectangular flat plate that has the sides respectively parallel to the first direction and the second direction when viewed from the thickness direction. The first electronic component 31 includes one surface 311 and the other surface 312 facing each other. The first electronic component 31 is made of, for example, a semiconductor substrate. In the first electronic component 31, an electrical functional unit is formed on the one surface 311 side, and no electrical functional unit is formed on the other surface 312 side.

For example, when the first electronic component 31 is formed from a semiconductor substrate, in the first electronic component 31, a transistor or the like that has been doped with a predetermined depth and a predetermined pattern is formed on the one surface 311 side of the semiconductor substrate. A conductor pattern connected to the transistor or the like is formed on the one surface 311. A bump for an external connection is formed on the one surface 311 and is connected to the conductor pattern. On the other surface 312 side of the first electronic component 31, doping or the like is not performed, and the semiconductor substrate itself is provided.

Similar to the first electronic component 31, the second electronic component 32 is a substantially rectangular flat plate having the sides respectively parallel to the first direction and the second direction when viewed from the thickness direction. The second electronic component 32 includes one surface 321 and the other surface 322 facing each other. The second electronic component 32 is made of, for example, a semiconductor substrate. In the second electronic component 32, an electrical functional unit is formed on the one surface 321 side, and no electrical functional unit is formed on the other surface 322 side. The specific structure of the second electronic component 32 is similar to that of the first electronic component 31, and the description thereof will not be repeated.

The area (plane area) of the first electronic component 31 and the second electronic component 32 viewed from the thickness direction is smaller than the area (plane area) of the board 20 viewed from the thickness direction. The plane area of the first electronic component 31 and the plane area of the second electronic component 32 are substantially equal to each other. The plane area of the first electronic component 31 and the plane area of the second electronic component 32 may not be equal to each other. The plane area of the first electronic component 31 may be larger than the plane area of the second electronic component 32.

The first electronic component 31 is mounted on the first main surface 201 of the board 20. At this time, the first electronic component 31 is disposed so that the one surface 311 faces the first main surface 201. The bump of the first electronic component 31 is joined to the land conductor on the first main surface 201 of the board 20.

The second electronic component 32 is mounted on the second main surface 202 of the board 20. At this time, the second electronic component 32 is disposed so that the one surface 321 faces the second main surface 202. The bump of the second electronic component 32 is joined to the land conductor on the second main surface 202 of the board 20.

At least a portion of the first electronic component 31 and at least a portion of the second electronic component 32 overlap each other when viewed from the thickness direction. For example, in the case of FIG. 1, the plane area of the first electronic component 31 is equal to the plane area of the second electronic component 32, and the first electronic component 31 and the second electronic component 32 overlap each other on the entire surface.

The mold resin 41 has an insulating property. The mold resin 41 covers the first main surface 201 side of the board 20. The mold resin 41 covers the side surface of the first electronic component 31, and does not cover the other surface 312 of the first electronic component 31. In other words, the other surface 312 of the first electronic component 31 is exposed to the outside of the mountable electronic component 10. For example, the other surface 312 of the first electronic component 31 and the surface of the mold resin 41 on an opposite side of an abutting surface on the board 20 are flush with each other.

The mold resin 42 has an insulating property. The mold resin 42 covers the second main surface 202 side of the board 20. The mold resin 42 covers the side surface of the second electronic component 32, and does not cover the other surface 322 of the second electronic component 32. In other words, the other surface 322 of the second electronic component 32 is exposed to the outside of the mountable electronic component 10. For example, the other surface 322 of the second electronic component 32 and the surface of the mold resin 42 on an opposite side of an abutting surface on the board 20 are flush with each other.

The terminal conductor 50 is formed on the second main surface 202 side of the board 20. The terminal conductor 50 does not overlap the second electronic component 32 when the mountable electronic component 10 is viewed from the thickness direction.

The terminal conductor 50 has a columnar shape and penetrates the mold resin 42 in the thickness direction. One end of the terminal conductor 50 is connected to the wiring conductor on the second main surface 202 of the board 20. The other end of the terminal conductor 50 is exposed to the outside of the mountable electronic component 10 on the second electronic component 32 side.

With this structure, the terminal conductor 50 functions as a terminal for an external connection of the mountable electronic component 10.

In such a configuration, since at least a portion of the first electronic component 31 and at least a portion of the second electronic component 32 overlap each other, it is possible to reduce the entire plane area in comparison to a form in which the first electronic component 31 and the second electronic component 32 are arranged side by side.

In particular, it is possible to further reduce the plane area by overlapping the first electronic component 31 and the second electronic component 32 on the entire surface.

Since the other surface 312 of the first electronic component 31 and the other surface 322 of the second electronic component 32 are exposed, it is possible to reduce the thickness of the mountable electronic component 10 in comparison to a form in which the first electronic component 31 is covered with the mold resin 41 and the second electronic component 32 is covered with the mold resin 42. In particular, it is possible to further reduce the thickness of the mountable electronic component 10 by exposing both the other surface 312 of the first electronic component 31 and the other surface 322 of the second electronic component 32.

In this configuration, the electrical functional unit of the first electronic component 31 and the electrical functional unit of the second electronic component 32 are disposed on the board 20 side. That is, the electrical functional unit of the first electronic component 31 and the electrical functional unit of the second electronic component 32 are not exposed to the outside. Thus, it is possible to grind the mountable electronic component 10 from both sides in the thickness direction, and to further reduce the thickness. For example, it is possible to set the thickness of the first electronic component 31 and the second electronic component 32 to be less than about 100 µm. As described above, since the thickness of the first electronic component 31 and the second electronic component 32 is reduced, and the thickness of the board 20 is similarly reduced, the thickness of the mountable electronic component 10 is reduced.

As described above, in this configuration, the electrical functional unit of the first electronic component 31 and the electrical functional unit of the second electronic component 32 are not exposed to the outside. Thus, it is possible to suppress an adverse effect (radiation noise and the like) of the electrical functional unit of the first electronic component 31 and the electrical functional unit of the second electronic component 32 on the outside of the mountable electronic component 10, an adverse effect (superimposition of external noise and the like) on the electrical functional unit of the first electronic component 31 and the electrical functional unit of the second electronic component 32 from the outside of the mountable electronic component 10, and the like.

The first electronic component 31 and the second electronic component 32 may have the same electrical function or may have different functions. In the present disclosure, an electronic component mounted on the first main surface 201 side of the board 20 refers to as the first electronic component 31, and an electronic component mounted on the second main surface 202 side of the board 20 refers to as the second electronic component 32.

The mountable electronic component 10 having such a configuration is used by being mounted on another circuit board.

(First Aspect of Electronic Circuit Module)

FIG. 3A is a side sectional view illustrating a configuration of a first aspect of an electronic circuit module according to the first embodiment. FIG. 3B is a side sectional view illustrating a configuration of an electronic circuit module to be compared.

As illustrated in FIG. 3A, an electronic circuit module 90 includes a mountable electronic component 10, a module circuit board 91, a semiconductor circuit board 92, a chip type mounting component 93, a mold resin 941, a mold resin 942, and a terminal conductor 95.

The module circuit board 91 is a flat plate, and includes a main surface 911 and a main surface 912 facing each other.

The chip type mounting component 93 is, for example, so-called a chip type capacitor, a chip type inductor, or a chip type resistive element. The height (thickness) of the chip type mounting component 93 is equal to or more than the thickness of the mountable electronic component 10. In other words, the thickness of the mountable electronic component 10 is equal to or less than the height (thickness) of the chip type mounting component 93.

The mountable electronic component 10 and the chip type mounting component 93 are mounted side by side in the first direction on the main surface 911 of the module circuit board 91. At this time, in the mountable electronic component 10, the terminal conductor 50 is joined to the conductor pattern on the main surface 911 of the module circuit board 91.

The semiconductor circuit board 92 is mounted on the main surface 912 of the module circuit board 91. The semiconductor circuit board 92 has a structure in which an electrical functional unit is formed on one surface. The one surface on which the electrical functional unit is formed faces the main surface 912 of the module circuit board 91. At this time, when the electronic circuit module 90 is viewed from the thickness direction, the semiconductor circuit board 92 overlaps the mountable electronic component 10 and the chip type mounting component 93.

The mold resin 941 has an insulating property. The mold resin 941 covers the main surface 911 side of the module circuit board 91. The mold resin 941 covers the mountable electronic component 10 and the chip type mounting component 93. At this time, the mold resin 941 covers the other surface 312 of the first electronic component 31 in the mountable electronic component 10. Therefore, the other surface 312 of the first electronic component 31 is protected from the external environment of the electronic circuit module 90. Thus, the reliability of the electronic circuit module 90 is improved.

The mold resin 942 has an insulating property. The mold resin 942 covers the main surface 912 side of the module circuit board 91. The mold resin 942 does not cover the other surface (the surface on which the electrical functional unit is not formed) of the semiconductor circuit board 92, but may cover the other surface of the semiconductor circuit board 92.

The terminal conductor 95 has a columnar shape and penetrates the mold resin 942 in the thickness direction. One end of the terminal conductor 95 is connected to the wiring conductor on the main surface 912 of the module circuit board 91. The other end of the terminal conductor 95 is exposed to the outside of the electronic circuit module 90 on the semiconductor circuit board 92 side.

As illustrated in FIG. 3B, an electronic circuit module 90P to be compared includes an electronic component 31P, an electronic component 32P, a module circuit board 91, a semiconductor circuit board 92, a chip type mounting component 93, a mold resin 941, a mold resin 942, and a terminal conductor 95. The electronic circuit module 90P to be compared is the comparison target of the electronic circuit module 90 according to the first embodiment. Thus, only different portions from those of the electronic circuit module 90 will be described.

The electronic component 31P has the same function as the first electronic component 31, and the electronic component 32P has the same function as the second electronic component 32. However, in the electronic component 31P and the electronic component 32P, thinning (described later) is not easy unlike the first electronic component 31 and the second electronic component 32. Thus, the thickness of the electronic component 31P and the electronic component 32P is thicker than the thickness of the first electronic component 31 and the second electronic component 32.

The electronic component 31P, the electronic component 32P, and the chip type mounting component 93 are mounted side by side in the first direction on the main surface 911 of the module circuit board 91.

As can be seen by comparing FIGS. 3A and 3B, since the electronic circuit module 90 includes the configuration of the mountable electronic component 10 according to the first embodiment, the electronic circuit module 90 has advantages as follows over the electronic circuit module 90P to be compared.

In the electronic circuit module 90, the first electronic component 31 and the second electronic component 32 are arranged to overlap each other, by using the mountable electronic component 10. Therefore, in the electronic circuit module 90, it is possible to reduce the length (the length in the first direction in FIGS. 3A and 3B) in a direction parallel to the main surface 911 in comparison to the configuration in which the electronic component 31P and the electronic component 32P are arranged side by side on the main surface 911 of the module circuit board 91 as in the electronic circuit module 90P to be compared. For example, in the case of FIGS. 3A and 3B, a length L90 of the electronic circuit module 90 in the first direction is less than a length L90P of the electronic circuit module 90P in the first direction. That is, the electronic circuit module 90 has a smaller area than the electronic circuit module 90P.

The thickness of the mountable electronic component 10 is equal to or less than the height (thickness) of the chip type mounting component 93. Thus, even though the first electronic component 31 and the second electronic component 32 overlap each other, the thickness of the electronic circuit module 90 is determined by the height (thickness) of the chip type mounting component 93. Thus, the thickness of the electronic circuit module 90 is not more than the thickness of the electronic circuit module 90P to be compared. That is, even though the first electronic component 31 and the second electronic component 32 overlap each other, the electronic circuit module 90 does not become larger than the electronic circuit module 90P.

As described above, by using the configuration of the mountable electronic component 10 in the present embodiment, it is possible to reduce the size of the electronic circuit module 90 without reducing the number of functional elements as an electronic circuit of the electronic circuit module 90.

(Second Aspect of Electronic Circuit Module)

Figure 4A:
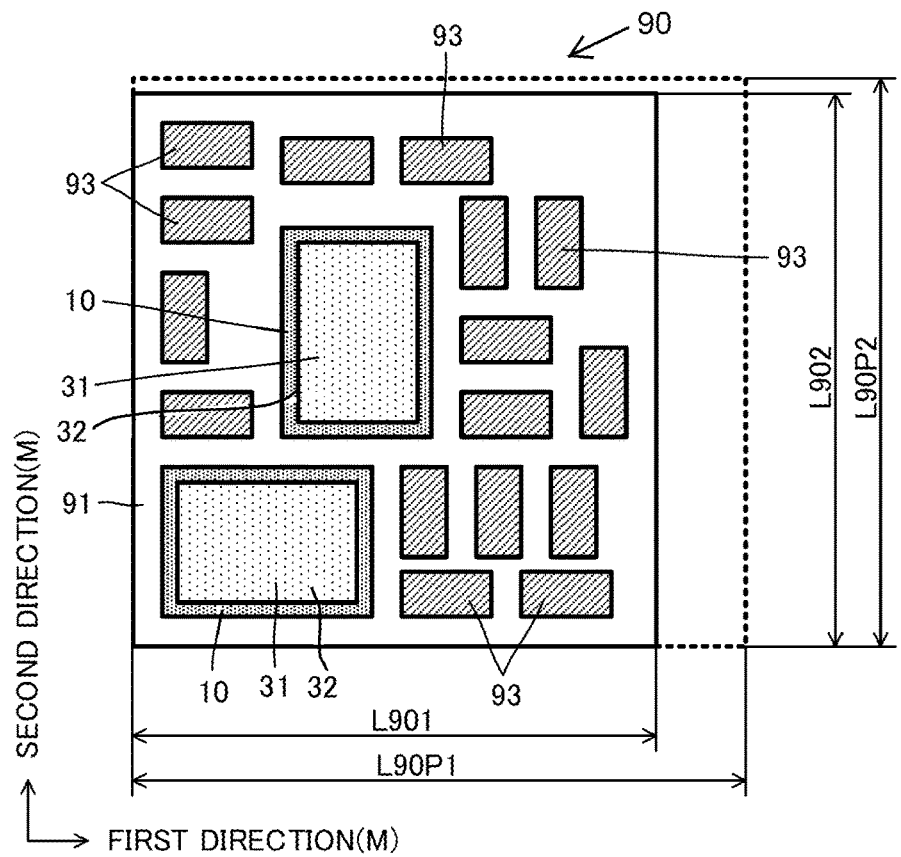
FIG. 4A is a plan view illustrating a configuration of a second aspect of the electronic circuit module according to the first embodiment.
Figure 4B:
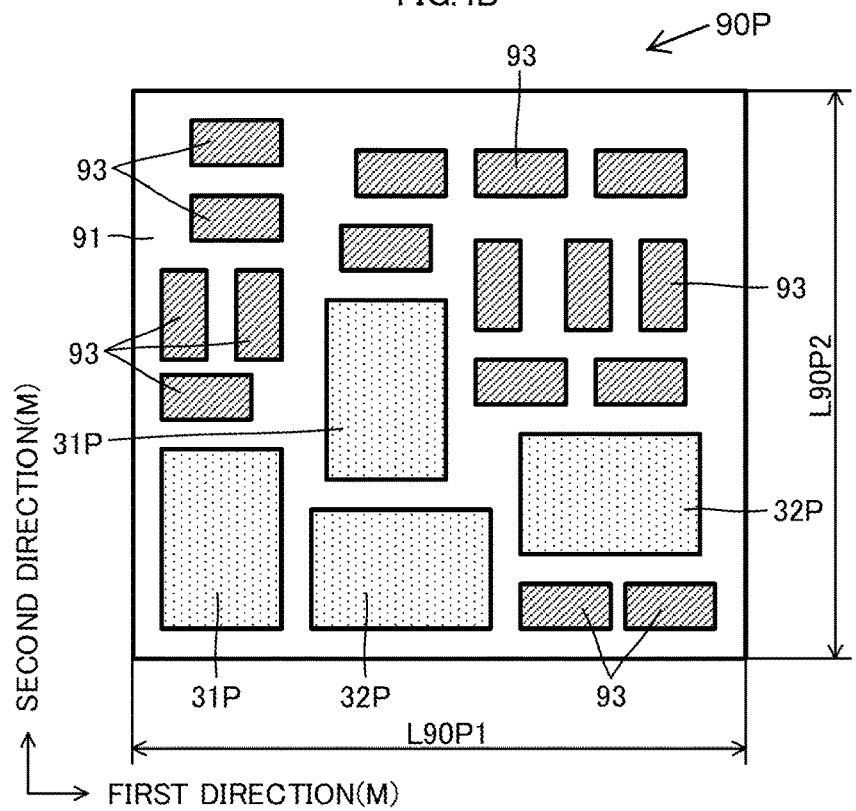
FIG. 4B is a plan view illustrating a configuration of an electronic circuit module to be compared.

FIG. 4A is a plan view illustrating a configuration of a second aspect of the electronic circuit module according to the first embodiment. FIG. 4B is a plan view illustrating a configuration of the electronic circuit module to be compared. An electronic circuit module 90 illustrated in FIG. 4A is derived from the electronic circuit module 90 illustrated in FIG. 3A, and an electronic circuit module 90P to be compared illustrated in FIG. 4B is derived from the electronic circuit module 90P illustrated in FIG. 3B. Thus, descriptions of the contents similar to those for FIGS. 3A and 3B will not be repeated.

As illustrated in FIG. 4A, the electronic circuit module 90 includes a plurality of mountable electronic components 10, a module circuit board 91, and a plurality of chip type mounting components 93. The electronic circuit module 90 may include a semiconductor circuit board, a mold resin, a terminal conductor, and the like as illustrated in FIG. 3A.

The module circuit board 91 is a flat plate. The chip type mounting component 93 is, for example, so-called a chip type capacitor, a chip type inductor, or a chip type resistive element.

The thickness of the plurality of mountable electronic components 10 is equal to or less than the height (thickness) of the chip type mounting component 93 having the largest thickness among the plurality of chip type mounting components 93.

The plurality of mountable electronic components 10 and the plurality of chip type mounting components 93 are mounted on the main surface of the module circuit board 91 with a predetermined arrangement pattern in a first direction (M) and a second direction (M) of the module.

As illustrated in FIG. 4B, the electronic circuit module 90P to be compared includes a plurality of electronic components 31P, a plurality of electronic components 32P, a module circuit board 91, and a plurality of chip type mounting components 93.

The plurality of electronic components 31P, the plurality of electronic components 32P, and the plurality of chip type mounting components 93 are mounted on the main surface of the module circuit board 91 with a predetermined arrangement pattern in the first direction (M) and the second direction (M) of the module.

As can be seen by comparing FIGS. 4A and 4B, since the electronic circuit module 90 includes the configuration of the mountable electronic component 10 according to the first embodiment, the electronic circuit module 90 has advantages as follows over the electronic circuit module 90P to be compared.

Compared to the configuration in which the electronic component 31P and the electronic component 32P are disposed separately like the electronic circuit module 90P to be compared, in the electronic circuit module 90, it is possible to reduce the lengths in the first direction (M) and the second direction (M) parallel to the main surface by overlapping the first electronic component 31 and the second electronic component 32. For example, in the case of FIGS. 4A and 4B, a length L901 of the electronic circuit module 90 in the first direction (M) is less than a length L90P1 of the electronic circuit module 90P in the first direction (M). Further, a length L902 of the electronic circuit module 90 in the second direction (M) is less than a length L90P2 of the electronic circuit module 90P in the second direction (M).

Thus, the electronic circuit module 90 has a smaller area than the electronic circuit module 90P. In particular, as illustrated in FIGS. 4A and 4B, it is possible to more effectively reduce the size when a plurality of first electronic components 31 (electronic components 31P) and a plurality of second electronic components 32 (electronic components 32P) are provided.

Further, as described above, since the thickness of the mountable electronic component 10 is equal to or less than the thickness of the chip type mounting component 93 having the largest thickness, the thickness of the electronic circuit module 90 is not more than the thickness of the electronic circuit module 90P to be compared. That is, even though the first electronic component 31 and the second electronic component 32 overlap each other, the electronic circuit module 90 does not become larger than the electronic circuit module 90P.

As described above, by using the configuration of the mountable electronic component 10 in the present embodiment, it is possible to reduce the size of the electronic circuit module 90 without reducing the number of functional elements as an electronic circuit of the electronic circuit module 90.

(Method of Manufacturing Mountable Electronic Component 10)

FIG. 5 is a flowchart illustrating a method of manufacturing the mountable electronic component according to the first embodiment. FIGS. 6A to 6D are side sectional views illustrating the states in a predetermined process in the method of manufacturing a mountable electronic component illustrated in FIG. 5.

Firstly, the first electronic component 31 is mounted on the first main surface 201 of the board 20, and the second electronic component 32 is mounted on the second main surface (main surface 202) (S11). At this time, the first electronic component 31 is mounted so that one surface 311 on which an electrical functional unit is formed faces the first main surface 201 of the board 20. The second electronic component 32 is mounted so that one surface 321 on which an electrical functional unit is formed faces the second main surface 202 of the board 20.

Figure 6A:
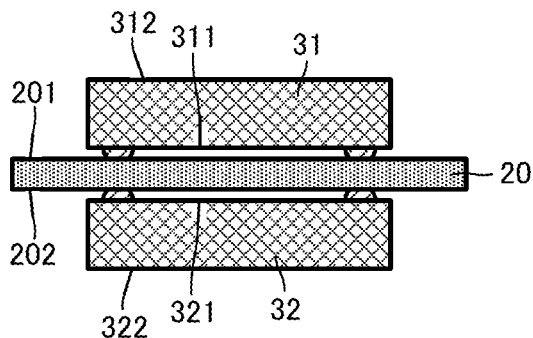
FIGS. 6A to 6D are side sectional views illustrating the states in a predetermined process in the method of manufacturing a mountable electronic component.
Figure 6B:
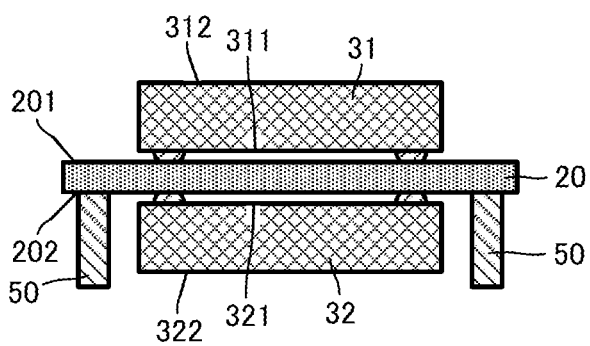

Then, a terminal conductor 50 is formed on the second main surface (main surface 202) side of the board 20 (S12). For example, specifically, as illustrated in FIG. 6B, the columnar terminal conductor 50 extending from the main surface 202 of the board 20 in a direction perpendicular to the main surface 202 is formed.

Figure 6C:
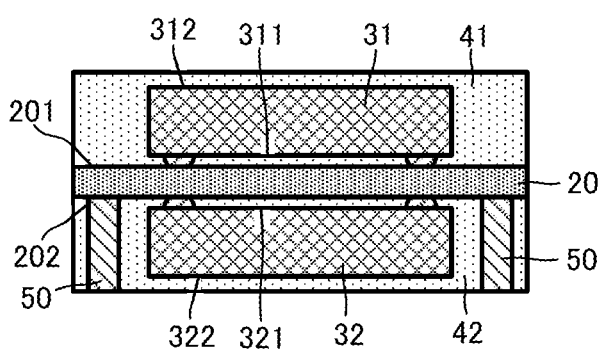

Then, both main surfaces of the board 20 are molded with an insulating resin (S13). For example, specifically, as illustrated in FIG. 6C, a mold resin 41 is formed on the main surface 201 side of the board 20. At this time, the mold resin 41 covers the side surface and the other surface 312 of the first electronic component 31. A mold resin 42 is formed on the main surface 202 side of the board 20. At this time, the mold resin 42 covers the side surface and the other surface 322 of the second electronic component 32.

Figure 6D:
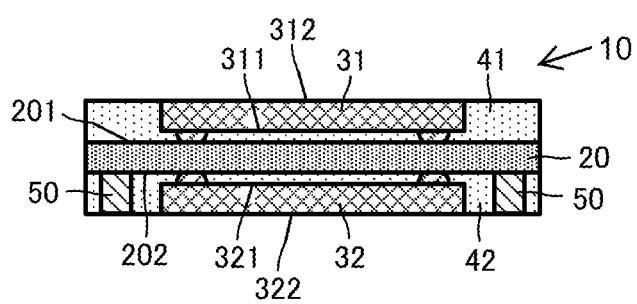

Then, the mold resin and the other surface of the electronic component are ground (S14). For example, specifically, as illustrated in FIG. 6D, the mold resin 41 is ground from the side opposite to the board 20 side. The first electronic component 31 is ground together with the mold resin 41 to a predetermined thickness from the other surface 312 side. The grinding is performed to thin the first electronic component 31 so as not to influence the electrical functional unit on the one surface 311 side of the first electronic component 31. Here, since the first electronic component 31 is held by the mold resin 41, it is possible to suppress the damage to the first electronic component 31 during grinding and to further reduce the thickness of the first electronic component 31, in comparison to a case where only the first electronic component 31 is provided.

In addition, the mold resin 42 is ground from the side opposite to the board 20 side. The second electronic component 32 is ground together with the mold resin 42 to a predetermined thickness from the other surface 322 side. The grinding is performed to thin the second electronic component 32 so as not to influence the electrical functional unit on the one surface 321 side of the second electronic component 32. Here, since the second electronic component 32 is held by the mold resin 42, it is possible to suppress the damage to the second electronic component 32 during grinding and to further reduce the thickness of the second electronic component 32, in comparison to a case where only the second electronic component 32 is provided.

As described above, by using the manufacturing method in the present embodiment, it is possible to more reliably manufacture the mountable electronic component 10 having a small thickness. Further, it is possible to further reduce the thickness of the mountable electronic component 10.

Figure 7:
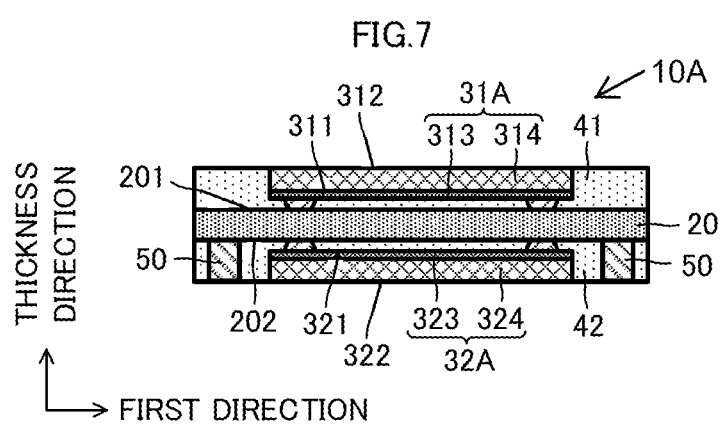
FIG. 7 is a side sectional view illustrating a configuration of a mountable electronic component according to a second embodiment.

Next, a mountable electronic component according to a second embodiment of the present disclosure will be described with reference to the drawings. FIG. 7 is a side sectional view illustrating a configuration of the mountable electronic component according to the second embodiment.

As illustrated in FIG. 7, in a mountable electronic component 10A according to the second embodiment, a configuration of a first electronic component 31A and a second electronic component 32A is different from that in the mountable electronic component 10 according to the first embodiment. The other configurations of the mountable electronic component 10A are similar to those of the mountable electronic component 10, and the description of the similar configurations will not be repeated.

The first electronic component 31A includes a piezoelectric substrate 313 and a support substrate 314. The support substrate 314 has an insulating property. The piezoelectric substrate 313 and the support substrate 314 are stacked. The main surface of the first electronic component 31A on the piezoelectric substrate 313 side is one surface 311 of the first electronic component 31A. The main surface of the first electronic component 31A on the support substrate 314 side is the other surface 312 of the first electronic component 31A. A conductor pattern for realizing an electrical functional unit such as a SAW filter is formed on the one surface 311.

The second electronic component 32A includes a piezoelectric substrate 323 and a support substrate 324. The support substrate 324 has an insulating property. The piezoelectric substrate 323 and the support substrate 324 are stacked. The main surface of the second electronic component 32A on the piezoelectric substrate 323 side is one surface 321 of the second electronic component 32A. The main surface of the second electronic component 32A on the support substrate 324 side is the other surface 322 of the second electronic component 32A. A conductor pattern for realizing an electrical functional unit such as a SAW filter is formed on the one surface 321.

The first electronic component 31A is mounted on the board 20 so that the one surface (main surface on the piezoelectric substrate 313 side) 311 faces the first main surface 201 of the board 20. The second electronic component 32A is mounted on the board 20 so that the one surface (main surface on the piezoelectric substrate 323 side) 321 faces the main surface 202 of the board 20.

The other surface (main surface on the support substrate 314 side) 312 of the first electronic component 31A is not covered with a mold resin 41. Similarly, the other surface (main surface on the support substrate 324 side) 322 of the second electronic component 32A is not covered with a mold resin 42.

With such a configuration, the mountable electronic component 10A can also obtain the similar effects to those of the mountable electronic component 10.

The mountable electronic component 10A shows a form in which a piezoelectric substrate is used for each of the plurality of electronic components, and the mountable electronic component 10 shows a form in which a semiconductor substrate is used for each of the plurality of electronic components. Both an electronic component using a semiconductor substrate and an electronic component using a piezoelectric substrate can be used as the mountable electronic component.

Figure 8A:
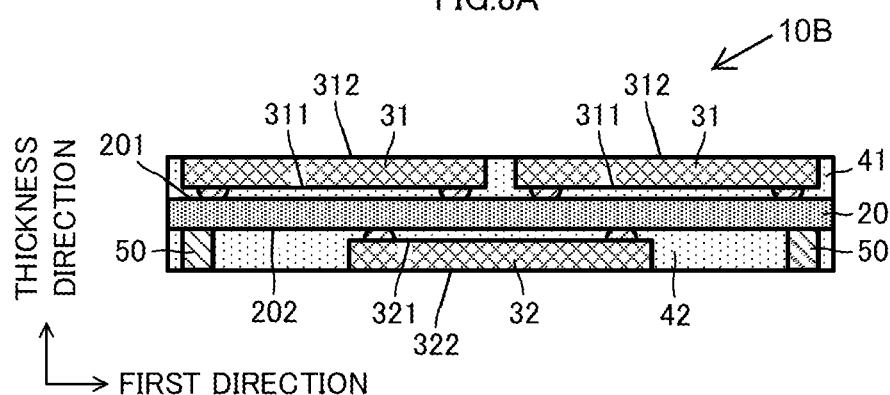
FIGS. 8A and 8B are side sectional views illustrating a configuration of a mountable electronic component according to a third embodiment.
Figure 8B:
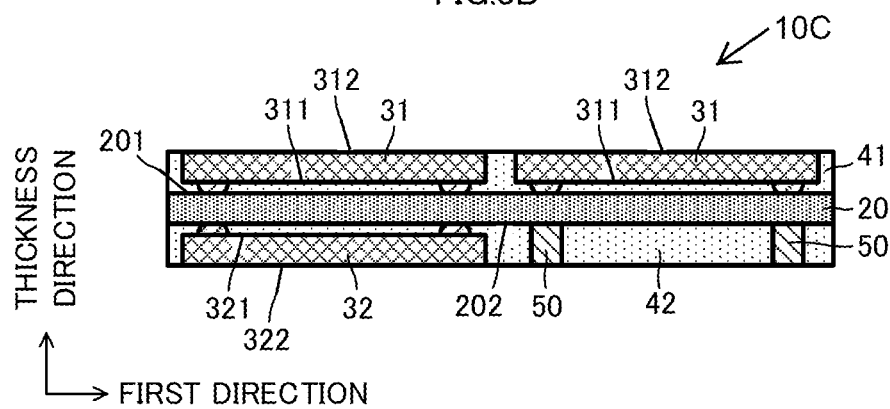

Next, a mountable electronic component according to a third embodiment of the present disclosure will be described with reference to the drawings. FIGS. 8A and 8B are side sectional views illustrating a configuration of the mountable electronic component according to the third embodiment.

As illustrated in FIGS. 8A and 8B, a mountable electronic component 10B and a mountable electronic component 10C according to the third embodiment are different from the mountable electronic component 10 according to the first embodiment in that the number of first electronic components 31 is more than the number of second electronic components 32. The other configurations of the mountable electronic component 10B and the mountable electronic component 10C are similar to those of the mountable electronic component 10, and the description of the similar configurations will not be repeated.

As illustrated in FIG. 8A, the mountable electronic component 10B includes two first electronic components 31 and one second electronic component 32. The electrical functions of the two first electronic components 31 may be the same or different.

The plane area of each of the two first electronic components 31 is substantially equal to the plane area of one first electronic component 31, for example.

The two first electronic components 31 are mounted on the first main surface 201 of a board 20. The two first electronic components 31 are mounted side by side on the first main surface 201.

The second electronic component 32 is mounted on the main surface 202 of the board 20. The second electronic component 32 overlaps each of the two first electronic components 31 when viewed from the thickness direction of the mountable electronic component 10B. In other words, a portion of the second electronic component 32 overlaps one of the first electronic components 31, and another portion of the second electronic component 32 overlaps the other one of the first electronic components 31.

A plurality of terminal conductors 50 are arranged to sandwich the second electronic component 32 when the mountable electronic component 10B is viewed from the thickness direction. Further, when the mountable electronic component 10B is viewed from the thickness direction, the plurality of terminal conductors 50 overlap either of the two first electronic components 31.

As illustrated in FIG. 8B, the mountable electronic component 10C is different from the mountable electronic component 10B illustrated in FIG. 8A in terms of the arrangement relation of the second electronic component 32 and the plurality of terminal conductors 50 with the two first electronic components 31.

The second electronic component 32 overlaps one of the two first electronic components 31 when viewed from the thickness direction of the mountable electronic component 10B. The plurality of terminal conductors 50 overlap the other of the two first electronic components 31 when the mountable electronic component 10B is viewed from the thickness direction. In this configuration, the plurality of terminal conductors 50 are arranged in a concentrated manner when viewed from the thickness direction of the mountable electronic component 10B.

As shown in the mountable electronic component 10B and the mountable electronic component 10C, when the number of electronic components provided in the mountable electronic component is an odd number of 3 or more and the plane areas of the plurality of electronic components are substantially equal to each other, the number of first electronic components 31 mounted on the first main surface 201 is more than the number of second electronic components 32 mounted on the main surface 202. In particular, the number of first electronic components 31 mounted on the first main surface 201 may be one more than the number of second electronic components 32 mounted on the main surface 202.

In this configuration, an empty space on which the second electronic component 32 is not mounted and which overlaps the first electronic component 31 is provided on the main surface 202 side. That is, when the total area ("the area of the first electronic component" in the present disclosure) of the electronic components on the first main surface 201 side of the board 20 is larger than the total area ("the area of the second electronic component" in the present disclosure) of the electronic components on the main surface 202 side, an empty space overlapping the first electronic component 31 is provided on the main surface 202 side. By arranging the plurality of terminal conductors 50 in this empty space, it is possible to effectively reduce the plane area of the mountable electronic component.

Also, regardless of the number of first electronic components 31 mounted on the first main surface 201 and the number of the second electronic components 32 mounted on the main surface 202, so long as the plane area of one first electronic component 31 or the total area of the plurality of first electronic components 31 mounted on the first main surface 201 is larger than the plane area of one second electronic component 32 or the total area of the plurality of second electronic components 32 mounted on the main surface 202, the configuration of a terminal conductor 50 similar to that in the mountable electronic component 10B or the mountable electronic component 10C can be adopted. Similar to the mountable electronic component 10B and the mountable electronic component 10C, it is possible to effectively reduce the size.

Figure 9:
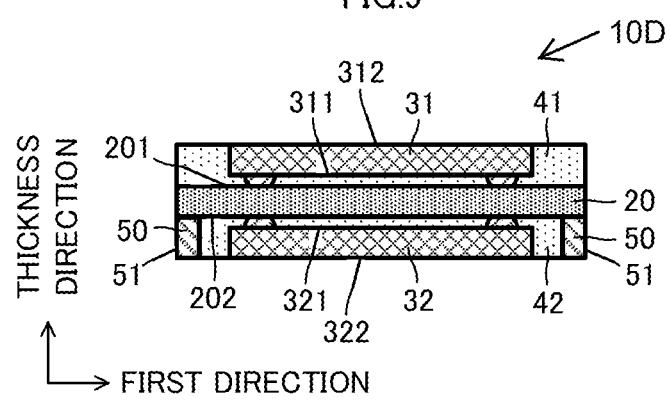
FIG. 9 is a side sectional view illustrating a configuration of a mountable electronic component according to a fourth embodiment.

Next, a mountable electronic component according to a fourth embodiment of the present disclosure will be described with reference to the drawings. FIG. 9 is a side sectional view illustrating a configuration of the mountable electronic component according to the fourth embodiment.

As illustrated in FIG. 9, a mountable electronic component 10D according to the fourth embodiment is different from the mountable electronic component 10 according to the first embodiment in a form of the terminal conductor 50. The other configurations of the mountable electronic component 10D are similar to those of the mountable electronic component 10, and the description of the similar configurations will not be repeated.

The terminal conductor 50 is exposed on the side surface of the mountable electronic component 10D. That is, the terminal conductor 50 has a side surface 51 exposed to the outside of the mountable electronic component 10D.

In such a configuration, a mold resin 42 is not provided on the terminal conductor 50 on the side opposite to the second electronic component 32. Thus, it is possible to reduce the plane area of the mountable electronic component 10D. Further, by providing the side surface 51 exposed to the outside, even though the exposed area of the terminal conductor 50 to the bottom surface (the surface flush with the other surface 322 of the second electronic component 32) of the mountable electronic component 10D is small, it is possible to supplement the bottom exposed area with the side surface 51. That is, even though the mountable electronic component 10D is made smaller, it is possible to suppress a decrease in the area joined to another module circuit board or the like.

Figure 10A:
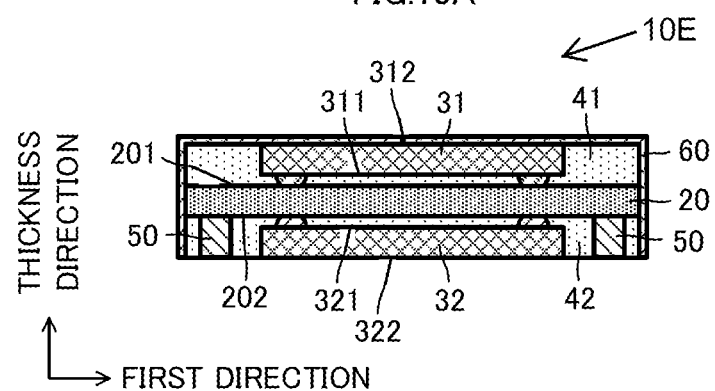
FIG. 10A is a side sectional view illustrating a configuration of a mountable electronic component according to a fifth embodiment.
Figure 10B:
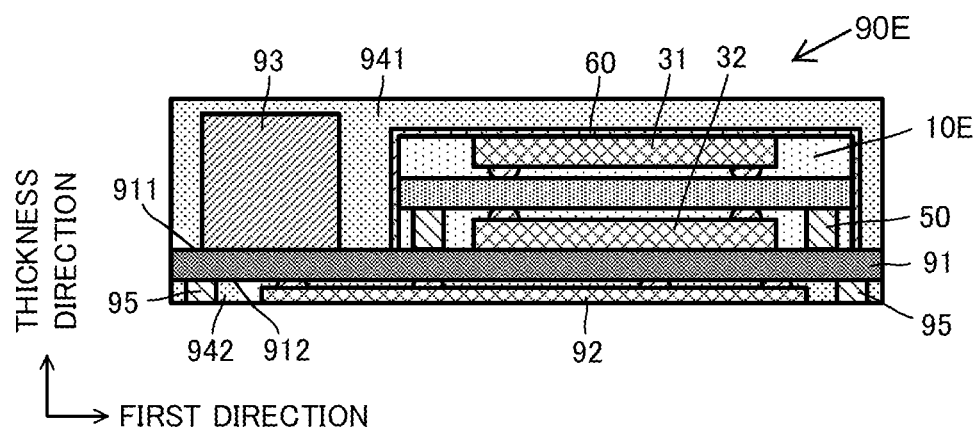
FIG. 10B is a side sectional view illustrating a configuration of an electronic circuit module according to the fifth embodiment.

Next, a mountable electronic component and an electronic circuit module according to a fifth embodiment of the present disclosure will be described with reference to the drawings. FIG. 10A is a side sectional view illustrating a configuration of the mountable electronic component according to the fifth embodiment. FIG. 10B is a side sectional view illustrating a configuration of the electronic circuit module according to the fifth embodiment.

As illustrated in FIG. 10A, a mountable electronic component 10E according to the fifth embodiment is different from the mountable electronic component 10 according to the first embodiment in that a shield film 60 is provided. The other configurations of the mountable electronic component 10E are similar to those of the mountable electronic component 10, and the description of the similar configurations will not be repeated.

The shield film 60 has conductivity and is a thin film (conductive film). The shield film 60 covers portions of the structural body (configuration of the mountable electronic component 10 according to the first embodiment) other than the outer surfaces of the mountable electronic component 10 at the second electronic component 32 side and the terminal conductor 50 side. The structural body is configured by a board 20, a first electronic component 31, a second electronic component 32, a mold resin 41, and a mold resin 42. The shield film 60 is preferably connected to the ground potential via, for example, a module circuit board 91 of an electronic circuit module 90.

With such a configuration, it is possible to suppress the radiation of noise from the first electronic component 31 and the second electronic component 32 to the outside. In addition, it is possible to suppress external noise from being received by the first electronic component 31 and the second electronic component 32.

As illustrated in FIG. 10B, an electronic circuit module 90E according to the fifth embodiment is different from the electronic circuit module 90 according to the first embodiment in that the mountable electronic component 10E is used. Other configurations of the electronic circuit module 90E are similar to those of the electronic circuit module 90, and the description of the similar configurations will not be repeated.

The electronic circuit module 90E includes the mountable electronic component 10E, a module circuit board 91, a semiconductor circuit board 92, a chip type mounting component 93, a mold resin 941, a mold resin 942, and a terminal conductor 95.

The mountable electronic component 10E and the chip type mounting component 93 are mounted on the main surface 911 of the module circuit board 91. The mountable electronic component 10E and the chip type mounting component 93 are covered with the mold resin 941.

In such a configuration, even though the electronic circuit module 90E is not covered with the conductive shield film, it is possible to suppress the radiation of noise from the first electronic component 31 and the second electronic component 32 to the outside, and the reception of noise from the outside by the first electronic component 31 and the second electronic component 32.

In addition, even though the electronic circuit module 90E is close to other electronic components, a short circuit does not occur through the shield film because there is no shield film. This makes it possible to arrange other electronic components to be close to the electronic circuit module 90E.

In each of the above-described embodiments, the form in which the mountable electronic component includes only a plurality of electronic components is described. However, the mountable electronic component can also include a capacitor, an inductor, a resistor, and the like formed by a conductor pattern formed on the board. Further, a mountable element may be disposed on the mountable electronic component as long as that shape of the mountable electronic component is such that its thickness is less than that of the electronic component.

Further, in each of the above-described embodiments, the other surface of the plurality of electronic components is not molded with resin. However, when the thickness of the mountable electronic component is smaller than that of the chip type mounting component, the other surface can be molded with resin.

In addition, the configurations of the above-described embodiments can be combined as appropriate, and the action and effect corresponding to each combination can be obtained.

What is claimed is:

1. A mountable electronic component comprising:
a board having a first main surface and a second main surface and including a wiring conductor;
a first electronic component mounted on the first main surface, wherein a first electrical functional unit is provided on one surface of the first electronic component and the first electrical functional unit is not provided on the other surface of the first electronic component;
a second electronic component mounted on the second main surface, wherein a second electrical functional unit is provided on one surface of the second electronic component and the second electrical functional unit is not provided on the other surface of the second electronic component;
a first mold resin provided on the first main surface;
a second mold resin provided on the second main surface; and
a terminal conductor configured to connect the wiring conductor of the board to an external circuit, wherein
the first electronic component is mounted on the board so that the one surface on which the first electrical functional unit is provided faces the first main surface,
the second electronic component is mounted on the board so that the one surface on which the second electrical functional unit is provided faces the second main surface,
at least a portion of the first electronic component and at least a portion of the second electronic component overlap each other when viewed from a thickness direction of the board,
the other surface of the first electronic component is exposed from the first mold resin, and
the other surface of the second electronic component is exposed from the second mold resin,
the first electronic component includes a first side surface extending from the one surface of the first electronic component to the other surface of the first electronic component,
the first mold resin covers the entire first side surface,
the second electronic component includes a second side surface extending from the one surface of the second electronic component to the other surface of the second electronic component, and
the second mold resin covers the entire second side surface, and
a conductive film covering the first electronic component, the first mold resin, a side surface of the board, and a side surface of the second mold resin and exposing a surface of the second electronic component on an opposite side to the board, and a surface of the second mold resin on an opposite side to the board.

2. The mountable electronic component according to claim 1, wherein
a plane area of the first electronic component is larger than a plane area of the second electronic component, and
the terminal conductor is provided on the second main surface side of the board, and overlaps at least partially the first electronic component when viewed from the thickness direction.

3. The mountable electronic component according to claim 1, wherein
the first electronic component and the second electronic component are semiconductor elements.

4. The mountable electronic component according to claim 1, wherein
the first electronic component and the second electronic component are piezoelectric elements.

5. The mountable electronic component according to claim 1, wherein
the terminal conductor is exposed from the side surface of the second mold resin.

6. The mountable electronic component according to claim 1, wherein
the terminal conductor is disposed only on one side surface side of the second electronic component when viewed from the thickness direction.

7. An electronic circuit module comprising:
the mountable electronic component according to claim 1;
a chip type mounting component; and
a module circuit board, wherein the mountable electronic component and the chip type mounting component are mounted on the same surface of the module circuit board, wherein
a thickness of the mountable electronic component is equal to or less than a thickness of the chip type mounting component.

8. The mountable electronic component according to claim 2, wherein
the first electronic component and the second electronic component are semiconductor elements.

9. The mountable electronic component according to claim 2, wherein
the first electronic component and the second electronic component are piezoelectric elements.

10. The mountable electronic component according to claim 2, wherein
the terminal conductor is exposed from the side surface of the second mold resin.

11. The mountable electronic component according to claim 3, wherein
the terminal conductor is exposed from the side surface of the second mold resin.

12. The mountable electronic component according to claim 4, wherein
the terminal conductor is exposed from the side surface of the second mold resin.

13. The mountable electronic component according to claim 2, wherein
the terminal conductor is disposed only on one side surface side of the second electronic component when viewed from the thickness direction.

14. A mountable electronic component comprising:
a board having a first main surface and a second main surface and including a wiring conductor;
a first electronic component mounted on the first main surface, wherein a first electrical functional unit is provided on one surface of the first electronic component and the first electrical functional unit is not provided on the other surface of the first electronic component;
a second electronic component mounted on the second main surface, wherein a second electrical functional unit is provided on one surface of the second electronic component and the second electrical functional unit is not provided on the other surface of the second electronic component;
a first mold resin provided on the first main surface;
a second mold resin provided on the second main surface; and
a terminal conductor configured to connect the wiring conductor of the board to an external circuit, wherein
the first electronic component is mounted on the board so that the one surface on which the first electrical functional unit is provided faces the first main surface,
the second electronic component is mounted on the board so that the one surface on which the second electrical functional unit is provided faces the second main surface,
at least a portion of the first electronic component and at least a portion of the second electronic component overlap each other when viewed from a thickness direction of the board, and
only the first electronic component and the second electronic component are mounted on the board
the first electronic component includes a first side surface extending from the one surface of the first electronic component to the other surface of the first electronic component,
the first mold resin covers the entire first side surface,
the second electronic component includes a second side surface extending from the one surface of the second electronic component to the other surface of the second electronic component, and
the second mold resin covers the entire second side surface of the second electronic component, and
a conductive film covering the first electronic component, the first mold resin, a side surface of the board, and a side surface of the second mold resin and exposing a surface of the second electronic component on an opposite side to the board, and a surface of the second mold resin on an opposite side to the board.

15. The mountable electronic component according to claim 14, wherein
a plane area of the first electronic component is larger than a plane area of the second electronic component, and
the terminal conductor is provided on the second main surface side of the board, and overlaps at least partially the first electronic component when viewed from the thickness direction.

16. The mountable electronic component according to claim 14, wherein
the first electronic component and the second electronic component are semiconductor elements.

17. The mountable electronic component according to claim 14, wherein
the terminal conductor is exposed from the side surface of the second mold resin.

18. The mountable electronic component according to claim 14, wherein
the terminal conductor is disposed only on one side surface side of the second electronic component when viewed from the thickness direction.

19. A mountable electronic component comprising:
a board having a first main surface and a second main surface and including a wiring conductor;
a first electronic component mounted on the first main surface, wherein a first electrical functional unit is provided on one surface of the first electronic component and the first electrical functional unit is not provided on the other surface of the first electronic component;
a second electronic component mounted on the second main surface, wherein a second electrical functional unit is provided on one surface of the second electronic component and the second electrical functional unit is not provided on the other surface of the second electronic component;
a first mold resin provided on the first main surface;
a second mold resin provided on the second main surface; and
a terminal conductor configured to connect the wiring conductor of the board to an external circuit, wherein
the first electronic component is mounted on the board so that the one surface on which the first electrical functional unit is provided faces the first main surface,
the second electronic component is mounted on the board so that the one surface on which the second electrical functional unit is provided faces the second main surface,
at least a portion of the first electronic component and at least a portion of the second electronic component overlap each other when viewed from a thickness direction of the board, and
only the first electronic component and the second electronic component are mounted on the board
the first electronic component includes a first side surface extending from the one surface of the first electronic component to the other surface of the first electronic component,
the first mold resin covers the entire first side surface,
the second electronic component includes a second side surface extending from the one surface of the second electronic component to the other surface of the second electronic component, and
the second mold resin covers the entire second side surface of the second electronic component, wherein
the first electronic component and the second electronic component are piezoelectric elements.

* * * * *